United States Patent
Shieu

[11] Patent Number: 5,191,332
[45] Date of Patent: Mar. 2, 1993

[54] DIFFERENTIATOR/INTEGRATOR BASED OVERSAMPLING CONVERTER

[75] Inventor: Yie-Yuan Shieu, Tainan, Taiwan

[73] Assignee: Industrial Technology Research Institute, Hsinchu, Taiwan

[21] Appl. No.: 654,099

[22] Filed: Feb. 11, 1991

[51] Int. Cl.$^5$ .............................................. H03M 3/00
[52] U.S. Cl. ..................................... 341/143; 375/26
[58] Field of Search ............... 341/143, 144, 155, 122; 375/26, 27, 28, 33, 34; 332/162

[56] References Cited

U.S. PATENT DOCUMENTS

| | | | |
|---|---|---|---|
| 4,704,600 | 11/1987 | Uchimura et al. .................. | 341/143 |
| 4,843,390 | 6/1989 | van Bavel et al. .................. | 341/139 |
| 4,996,699 | 2/1991 | Rudolph .............................. | 377/49 |
| 5,068,661 | 11/1991 | Kaneaki et al. ..................... | 341/143 |

Primary Examiner—A. D. Pellinen
Assistant Examiner—Brian K. Young
Attorney, Agent, or Firm—Darby & Darby

[57] ABSTRACT

An oversampling converter includes integrators and differentiators. The output of an integrator in the second stage of the oversampling converter is sent to the analog differentiator to produce a differentiated signal. The differentiated signal is then sent back to the input of the integrator in the first stage of the oversampling converter. The output code of this stage and its derivative and the output of the previous input stage are added by using a digital method, and then the equivalent code is sent to a control voltage reference by using a switched-capacitor method. The voltage produced by the switched-capacitor method is equal to the equivalent code and is sent to the input of the integrator in this stage. The input stage is a first order oversampling converter. The output of the integrator in the input stage is sent to the input of the next stage. The output codes of the two stages will produce high resolution output by digital calculations. The advantages of this method are the higher operation frequency and lower quantization noise of this oversampling converter.

10 Claims, 7 Drawing Sheets

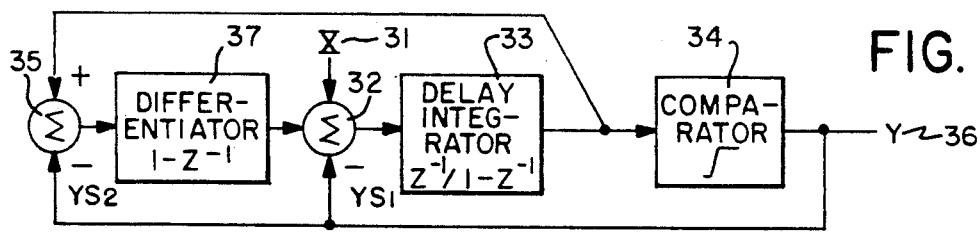
FIG. 3(a)
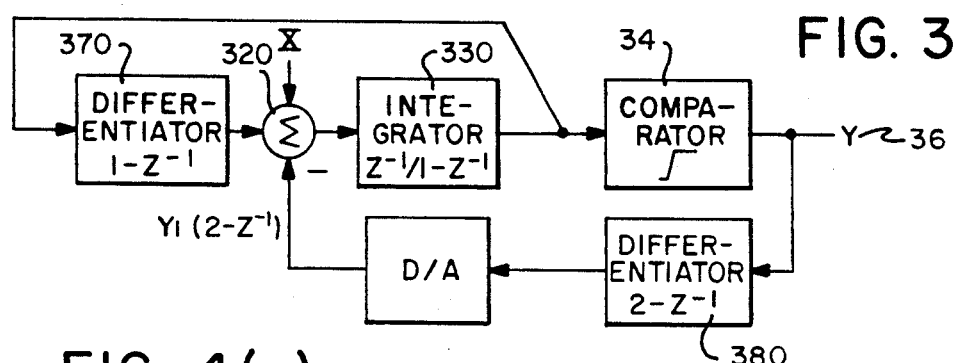
FIG. 3(b)
FIG. 4(a)
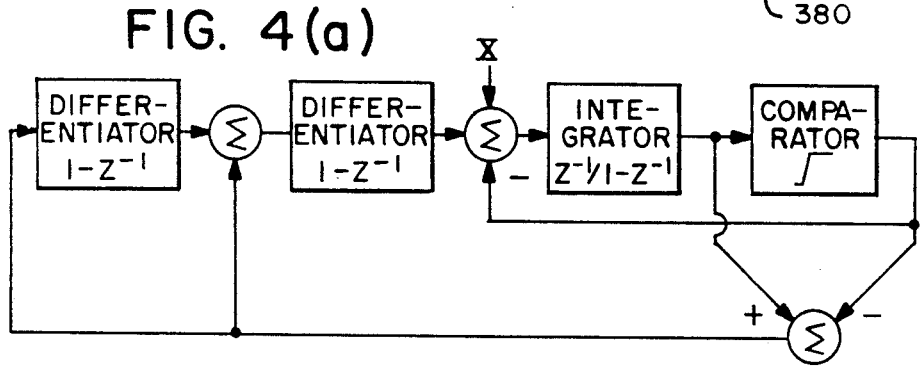
FIG. 4(b)
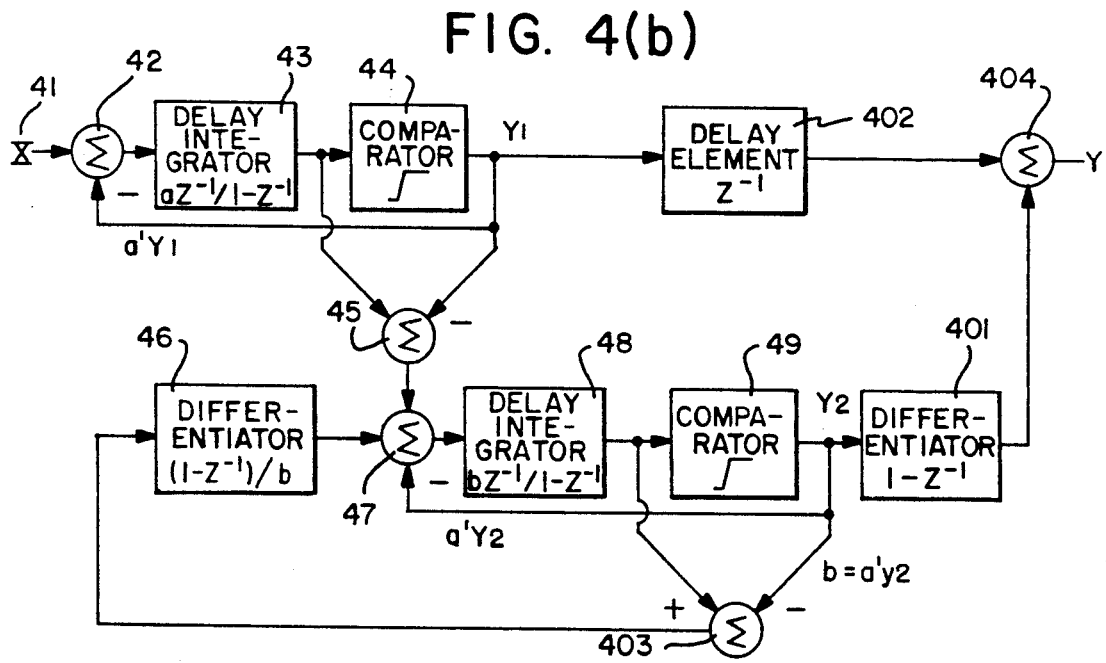

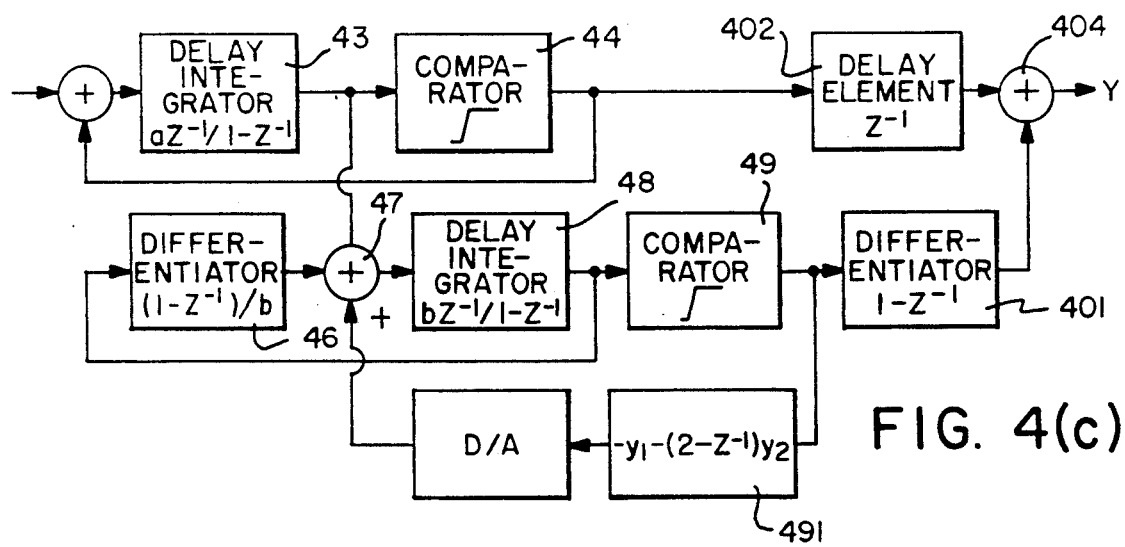
FIG. 4(c)
FIG. 5
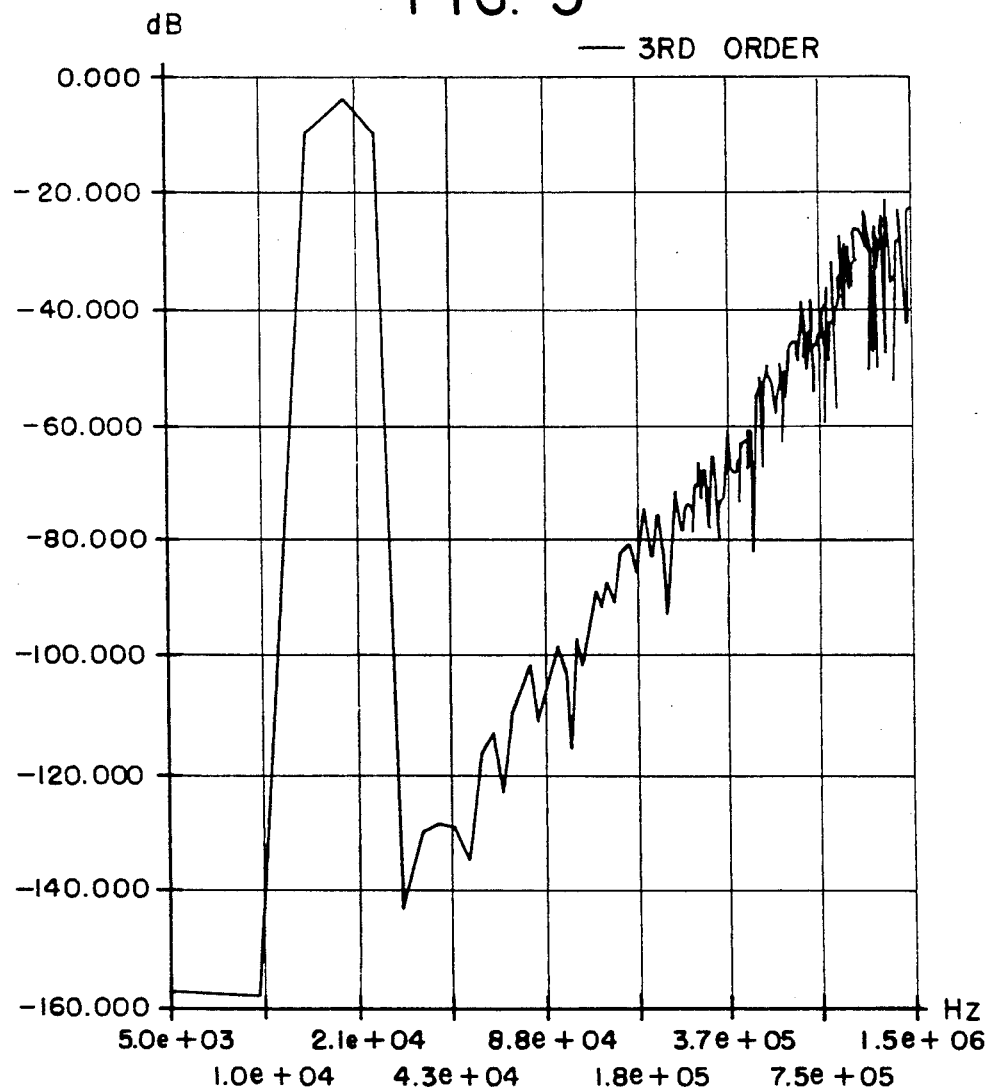

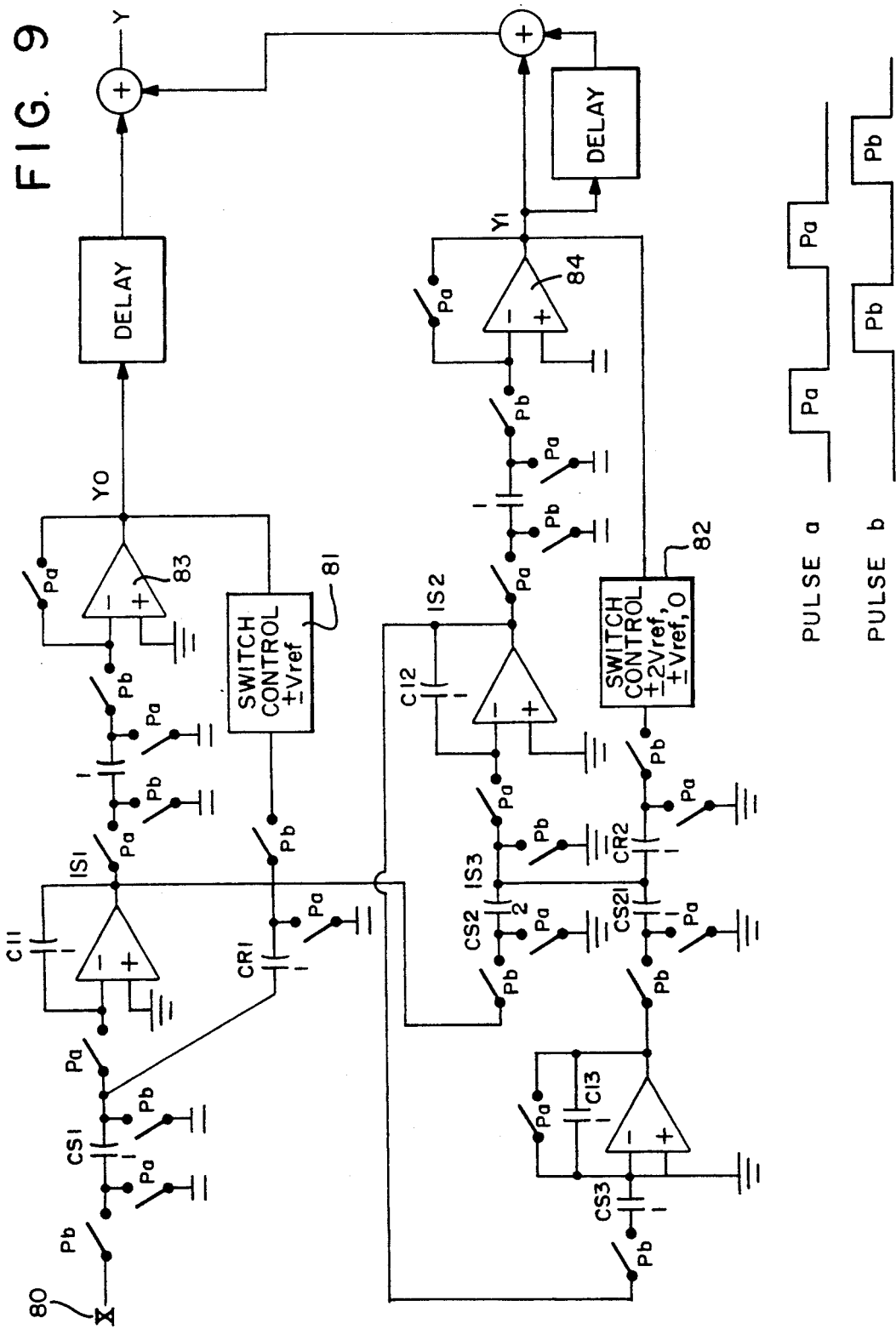

DIFFERENTIATOR/INTEGRATOR BASED OVERSAMPLING CONVERTER

BACKGROUND OF THE INVENTION

This invention relates to an oversampling delta-sigma modulator for audio applications on high frequency A/D or D/A converters. When the modulator is applied to A/D converters, the digital code of output is sent to digital filters to be converted to PCM signals. When the modulator is applied to D/A converters, the digital output code is sent to a switched-capacitor circuit to be converted to an analog waveform with high precision.

The prior structure of delta-sigma modulators can be seen, for example, in J. C. Candy, "A use of double integration in sigma-delta modulation", IEEE, Trans. Comm. COM-33, pp 249-258, Mar., 1985. Also see, for example, Uchimura et. al., "An oversampling converter", U.S. Pat. No. 4,704,600.

FIG. 1 is the prior art of a second order delta-sigma modulator in the z-domain. The bandwidth of the input signal is much lower than the sampling rate. The adder 12 adds the input signal and the negative feedback of output signal Y together, and sends the results to an integrator 13. The integrated output is then sent to an adder 14 to be combined with the negative feedback of output Y. The derived value of the adder 14 is then sent to a delay integrator 15. Finally, the comparator compares the output of the delay integrator 15 and threshold voltages to produce the next output digital code. The comparator has one or two threshold voltages. If the integrated value is larger than the threshold voltage, then the output digital code Y will be 1, else the output code will be $-1$.

The transfer function of the overall system can be seen from z-domain. If the comparator is thought to be an adder with extra $Q(z)$ input, where $Q(z)$ is the z-transform of the difference between comparator input and output, then $$Y(z) = X(z)z^{-1} + (1-z^{-1})^2 Q(z) \tag{1}$$

Equation (1) shows that the output code Y contains the low frequency signal X and high frequency quantization noise after differentiating. Hence, the signal to noise ratio will be decreased in the low frequency signal band. The high resolution signal is derived by using a low pass filter to filter the high frequency quantization noise. This structure must finish the integration of the integrators 13 and 15, and the comparison of the comparator 16. In the two phase clock, phase A must finish integration and comparison, while phase B must finish integration. Hence, the clock rate is limited by phase A. So, the structure is not suitable for high frequency operation. From another point of view, the bandwidth of the operational amplifier and the speed of the comparator will be double.

When the structure of FIG. 1 is cascaded with a first order converter, the quantization noise of the first order converter can be the input of FIG. 1. By combining the outputs of the first order converter and FIG. 1, the overall system with third order differentiated noise is stable when the input operates below $-2$ dBr. But the settling characteristic is degraded due to the critical path of FIG. 1.

FIG. 2 is another oversampling converter for high resolution applications. BL1, BL2, and BL3 are stable first order oversampling converters. The adder 207 receives the quantization noise of BL1 and sends it to the input of BL2. Also, the adder 208 receives the quantization noise of BL2 and sends it to the input of BL3. The output codes of BL1, BL2, and BL3 are then digitally calculated to derive the characteristic of the third order differentiated noise plus signal, so the equivalent quantization noise is further decreased without stability problems. The cost of the circuit is the 3-stage cascade of the first order converters and larger digital circuits.

It is an object of the present invention to provide an oversampling converter with simpler structure than that of the conventional oversampling converter.

It is another object of the present invention to provide an oversampling converter which can operate on high frequency.

It is still another object of the present invention to provide an oversampling converter with lower quantization noise.

It is still another object of the present invention to provide an oversampling converter with fewer output levels.

In order to achieve the above objects, the present invention provides one structure by adapting an analog differentiator to modify the two stage cascade of first order converters to a third order delta-sigma converter. The analog differentiator can be implemented with an SC differentiator or delay element.

In accordance with a preferred embodiment of the invention, an input signal having a bandwidth much lower than the sampling frequency is sent to a first order converter having an integrator and comparator. The output of the integrator in this stage enters the second order converter configured by a differentiator, integrator, and comparator. The output of the delay integrator is sent to the differentiator to produce one delay term after differentiating. Also, the output codes of the first input stage and that of the second stage plus its derivative are digitally calculated and adapt negative feedback to control the voltage reference by using switched-capacitor method. The controlled values of the voltage reference are then sent back to the input of the second stage. Hence, the critical path among integrator, comparator and differentiator will be canceled and the operation speed can be doubled.

Due to the two stage cascade of the invention, the output code is derived from the result of the first stage output and the derivative of the second stage output. Hence, the real output has only four levels in comparison with seven levels of a three stage cascade. So, the digital or analog filter will be simpler.

When the structure is implemented by digital methods, the output of the differentiator can be subtracted by the comparator input of the first stage. The resultant circuit has a higher signal to noise ratio due to the higher order noise shaping effect.

BRIEF DESCRIPTION OF THE DRAWINGS

FIGS. 3(a) and 3(b) are block diagrams of the second order delta-sigma converter of the present invention.

FIG. 4(a) is a block diagram of the one-stage third order delta-sigma converter of the present invention.

FIGS. 4(b) and 4(c) are block diagrams of the two-stage third order delta-sigma converter of the present invention.

FIG. 5 is the simulated spectrum of FIG. 4 when the input level is equal to −2 dBr.

FIG. 9 is a schematic diagram of a preferred embodiment of FIG. 4(c);

DETAILED DESCRIPTION OF THIS INVENTION

Figure 1:
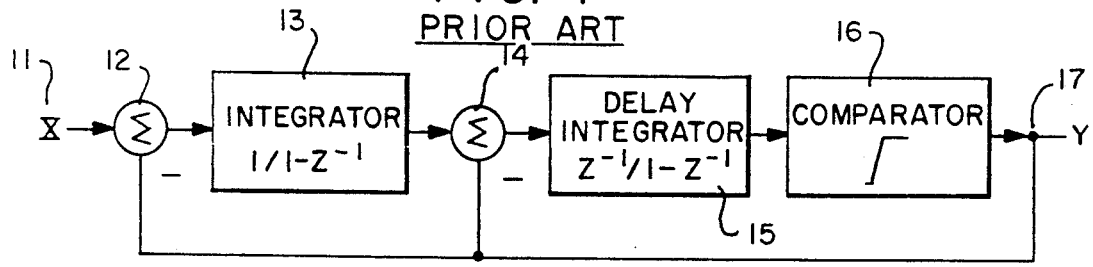
FIG. 1 is the block diagram of the prior art double loop delta-sigma modulator.
Figure 2:
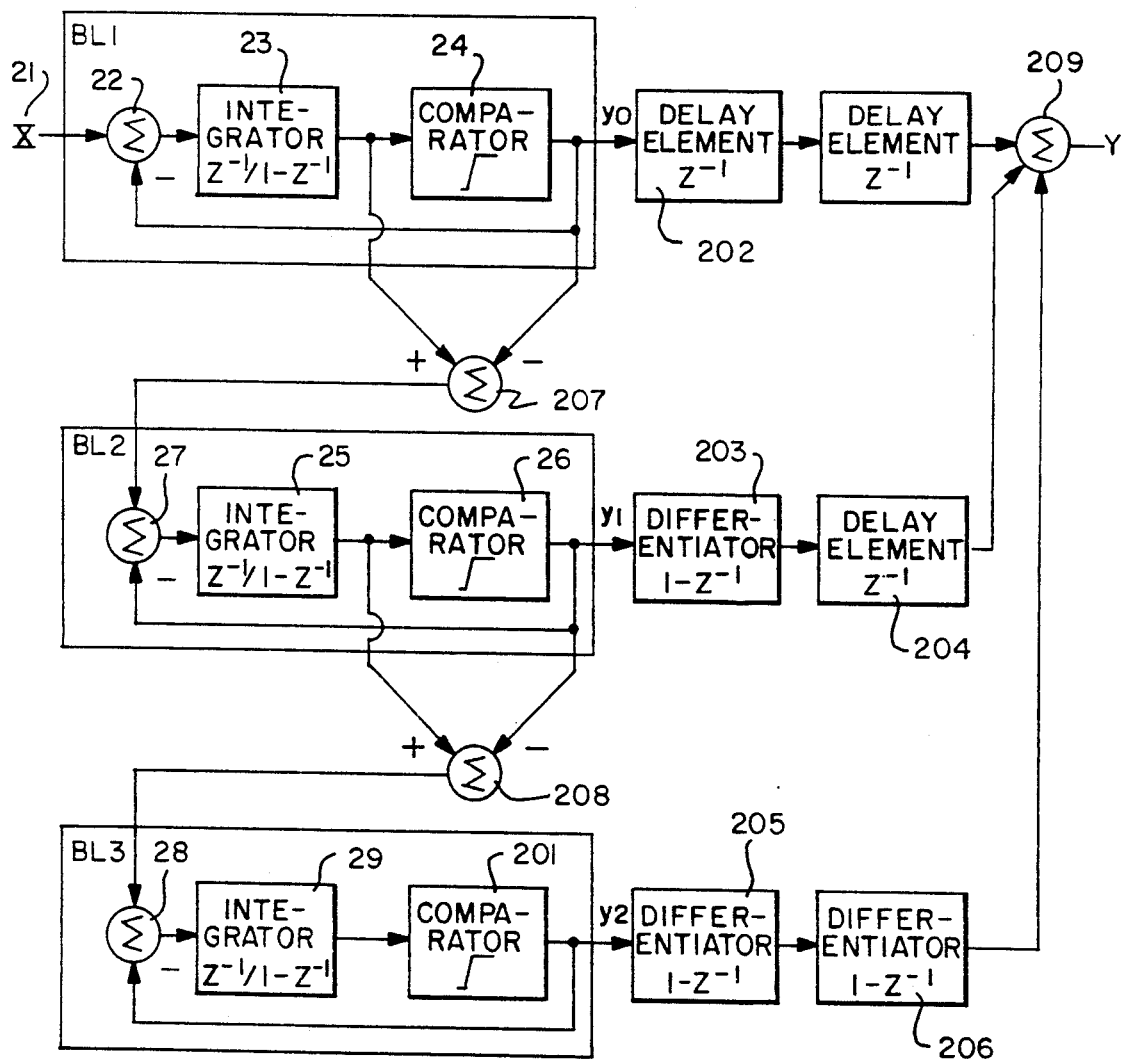
FIG. 2 is the block diagram of the prior art triple integration delta-sigma modulator.

FIG. 3(a) is the equivalent block diagram in Z-domain, with X being the input signal having a bandwidth lower than the sampling rate. This input signal X is sent to the following delta-sigma modulator to produce a digital output code Y. The delta-sigma modulator is comprised of:

An adder 32 for adding the input signal X, the negative feedback YS1 of the output Y and the output of the differentiator 37;

A delay integrator 33 for integrating the output of the adder 32;

An adder 35 for adding the output of the integrator and the negative feedback YS2 of the output Y;

A differentiator 37 for differentiating the output of the adder 35; and

A comparator 34 for comparing the output of integrator 33 to threshold voltages and deriving −1 or +1 as output codes. FIG. 3(b) is another form of FIG. 3(a). The adder 35 of FIG. 3(a) can be eliminated if the output of the integrator 330 acts as the input of the differentiator 370 and YS2 is digitally differentiated to be added to the adder 320. Hence, the critical path among the integrator, differentiator and comparator will disappear.

In FIG. 3(a), if Q(z) is the difference between the input and output of the comparator 34, i.e., the z-transform of the quantization noise, then the comparator 34 can be replaced by an adder with an extra Q(z) input. Therefore, $$Y(z) = Xz^{-1} + (1-z^{-1})(Q(z) - Q(z)z^{-1}) \quad (2)$$
$$= Xz^{-1} + (1-z^{-1})^2 Q(z)$$

Equation (2) shows the same transfer function as Equation (1), hence the second order noise shaping effect can be derived.

If the integrator 33 in FIG. 3(a) has the characteristic of high gain in low frequency and low gain in high frequency, and if the transfer function of the differentiator 37 multiplied by integrator 33 can produce a delay term $z^{-1}$, then the above effect of second order noise shaping still exists.

FIG. 4(a) is the improvement of FIG. 3(a), where another differentiator may be cascaded prior to the adder 35. By sending the Q(z) to the extra differentiator and cascading the differentiated result to the adder 35, the third order transfer function of noise shaping can be derived. When the comparator 34 is just two-level, the system is unstable. In order to alleviate the stability problem, a comparator with more levels will be needed or the pole locations of the noise transfer function should be moved.

FIG. 4(b) is another combination that provides a stable structure. X is an input signal with a bandwidth much lower than the sampling rate. The input signal is sent to a following delta-sigma modulator to produce a digital output Y.

The delta sigma modulator comprises:

An adder 42 for adding the input signal X and the negative feedback YS1 of the output Y1;

A delay integrator 43 for integrating the output of the adder 42;

A comparator 44 for comparing the output of the integrator 43 with threshold voltages to derive −1 or +1 as output codes in signal Y1;

An adder 45 for subtracting the output from the input of the comparator 44;

An adder 47 for adding the output of the adder 45, the negative feedback YS1 of the output Y2 and the output of the differentiator 46;

A delay integrator 48 for integrating the output of the adder 47;

An adder 403 for adding the output of the integrator 48 and the negative feedback YS2 of the output Y2;

A differentiator 46 for differentiating the output of the adder 403;

A comparator 49 for comparing the output of the integrator 48 to a threshold voltage for deriving −1 or +1 as output code of the signal Y2; and An adder 404 for adding the output of the delay element 402 and the output of the differentiator 401. FIG. 4(c) is another form of FIG. 4(b). The adder 45 can be eliminated if the output of the integrator 43 acts as the input of the adder 47. The adder 403 can be eliminated if the output of the integrator 48 acts as the input of the differentiator 46 and is differentiated to be added to Y1 with the adder 47. Hence, the critical path among the integrator, differentiator and comparator will disappear.

In FIG. 4(b), if Q1(z) is the difference between the input and output of the comparator 44, i.e., the z-transform of the first quantization noise, then the comparator 44 can be replaced by an adder with extra Q1(z) input. If Q2(z) is the difference between the input and output of the comparator 49, i.e., the z-transform of the second quantization noise, then the comparator 49 can be replaced by an adder with an extra Q2(z) input. Therefore, $$Y1 = Xz^{-1} + (1-z^{-1}) Q1(z),$$

$$Y2 = -Q1(z)z^{-1} + (1-z^{-1})^2 Q2(z),$$

$$Y = Y1\, z^{-1} + Y2(1-z^{-1}) = Xz^{-2} + (1-z^{-1})^3\, Q(z) \quad (3)$$

If the output codes Y1 and Y2 have two levels respectively, then the output Y will have four levels.

The system in FIG. 4(b) is stable even when the input level is equal to −2 dBr. The output spectrum at a −2 dBr input level is shown in FIG. 5, which is derived by 1024 output code, using a hanning window, and making the input sequence after periodic extension have no break point. The characteristic of 60 dB/decade due to the third order noise transfer function can be easily seen.

Figure 6:
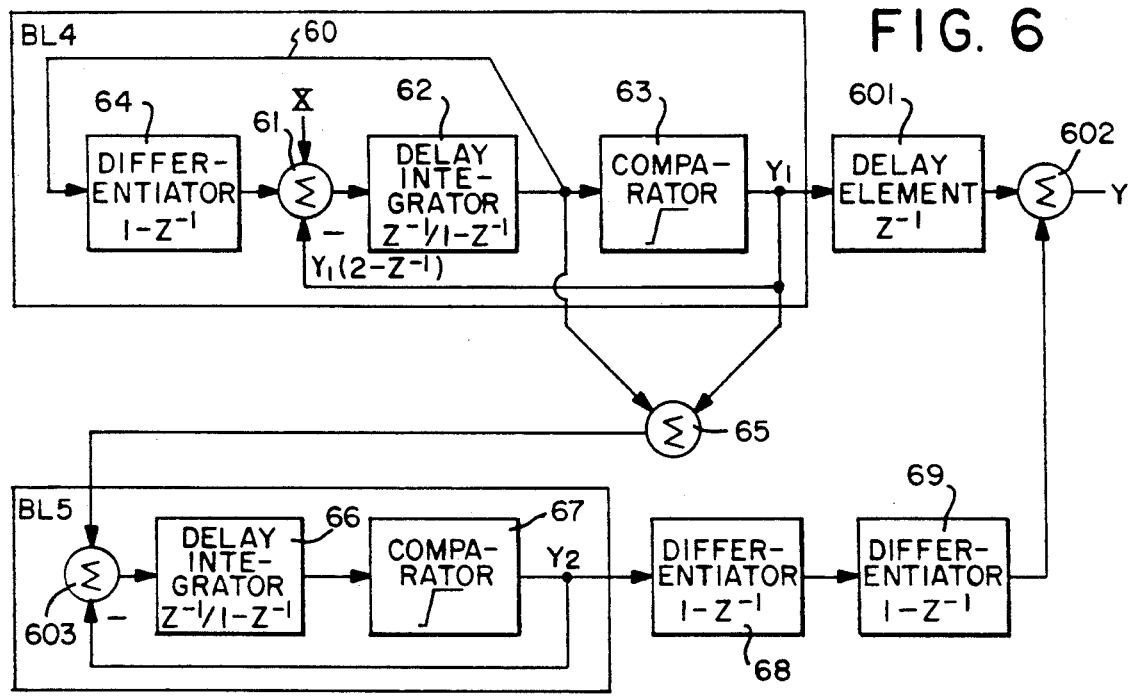
FIG. 6 is a block diagram of another third order delta-sigma converter of the present invention.

FIG. 6 is still another stable combination. It can be shown from prior results that the output of the comparator 63 contains data and 2nd order differentiated quantization noise. By sending the negative quantization noise of BL4 to the input of the first order converter BL5, the third order noise transfer function can be derived as follows.

$$Y1 = Xz^{-1} + (1-z^{-1})^2 Q1(z)$$

$$Y2 = -Q1(z)z^{-1} + (1-z^{-1}) Q2(z).$$

$$Y = Y1 z^{-1} + (1-z^{-1})^2 Y2 = Xz^{-2} + (1-z^{-1})^3 Q2(z) \quad (4)$$

where Q1(z) is the quantization noise of BL4, and Q2(z) is the quantization noise of BL5

Figure 7:
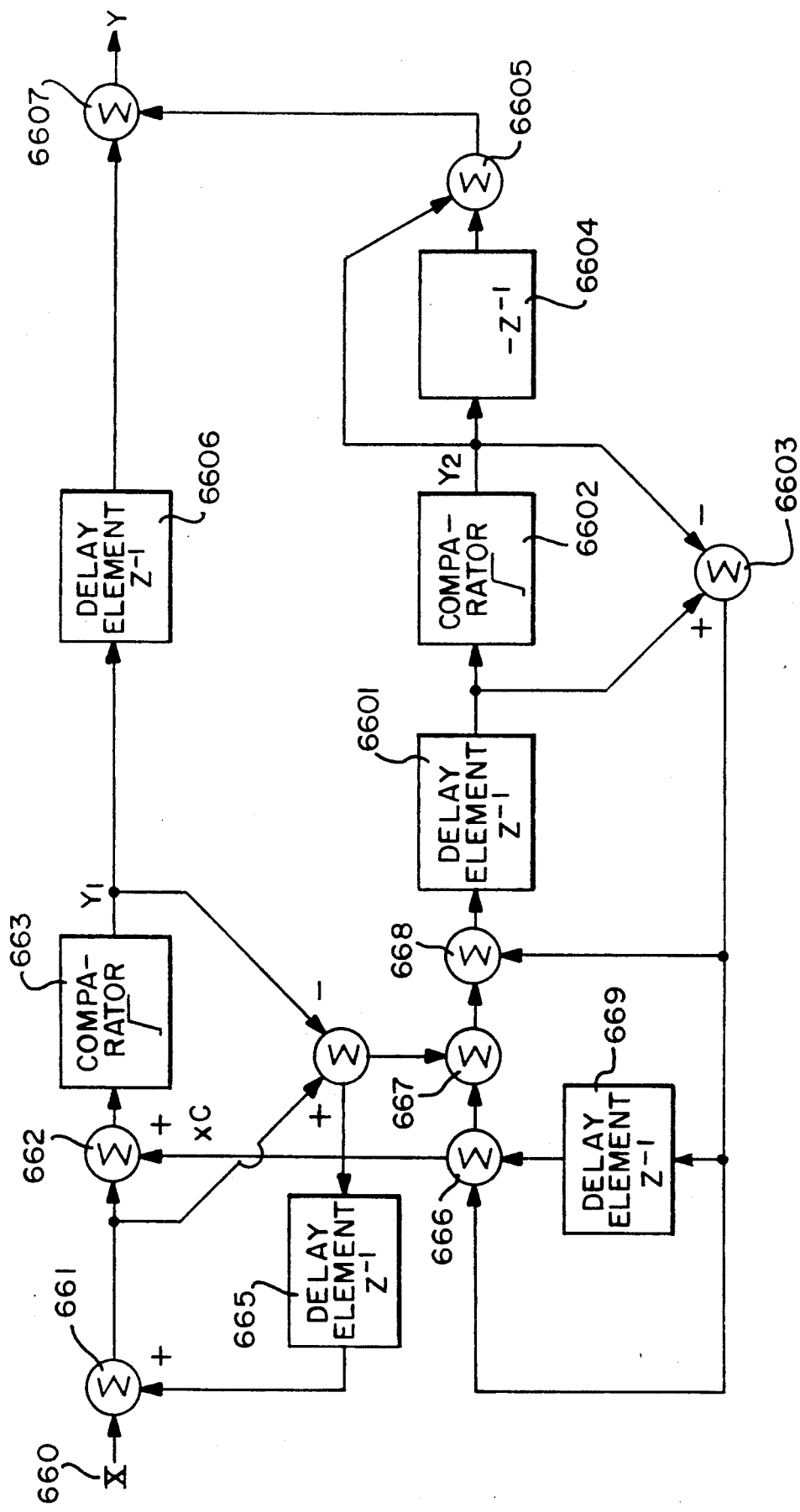
FIG. 7 is the digital implementation of the present invention with one new feedback.

The critical path of BL4 is removed by digitally calculating the $-Y1(1-z^{-1})$ plus $-Y1$ and sending the result to adder 61. If an error source e1 appears in adder 65, the contribution to the output code will be $e1(1-z^{-1})^2$. Therefore, the matching requirement between BL4 and BL5 will further be decreased. The digital implementation of this invention is shown in FIG. 7 where the real output is Y1 plus $(1-z^{-1})$Y2. In FIG. 7, an extra feedback is added to further decrease the quantization noise. This figure shows:

an input signal X with a bandwidth much lower than its sampling rate;

The combination quantization noise means for subtracting the outputs of the comparator 663 and the adder 661;

An adder 664 for deriving the combination quantization noise and sending it to the shift register 665;

An input adder 661 for adding the input signal and the output of the shift register 665;

The combination quantization noise is sent to the input of next stage BL6;

The output of the differentiator in BL6, (the output of the adder 666), is sent back to the adder 662 after multiplying by c; and The output of the adder 662 decides the new output of the comparator 663.

The transfer function of this structure can be derived as follows:

If Q1(z) is the difference between the input and output of the comparator 663, that is to say, the z-transform of the first quantization noise, then the comparator can be replaced by an adder with extra Q1(z) input. If Q2(z) is the difference between the input and output of the comparator 6602, that is to say, the z-transform of the second quantization noise, then the comparator 6602 can be replaced by an adder with extra Q2(z) input, therefore, $$Y1 = Xz^{-1} + (1-z^{-1})(Q1 - c^x(1-z^{-1})Q2)$$

$$Y2 = -Q1 - c^x(1-z^{-1})Q2)(z)z^{-1} + (1-z^{-1})^2 Q2$$

$$Y = Y1 z^{-1} + (1-z^{-1}) Y2 = Xz^{-2} + (1-z^{-1})^3 Q2 \quad (5)$$

where $Q1 - c^x(1-z^{-1}) Q2$ is the combination quantization noise. The c feedback will decrease the quantization noise when the input signal is decreased.

Figure 8:
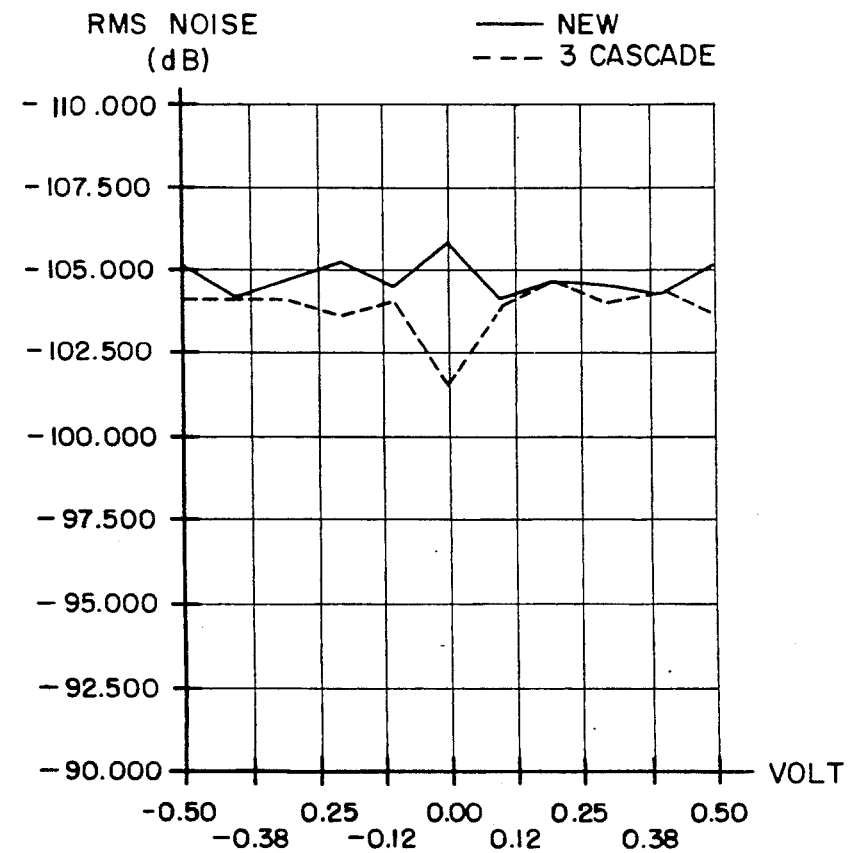
FIG. 8 is the rms noise verses DC bias with or without new feedback.

FIG. 8 shows the DC bias versus rms noise. It can be seen from FIG. 8 that the rms noise will be decreased to an amount of 4 dB by the c feedback when the DC bias is equal to 0V.

DETAILED DESCRIPTION OF THE PREFERRED EMBODIMENTS

FIG. 9 is the preferred embodiment of FIG. 4(c). The single ended circuit is shown in FIG. 9, but the real circuit is of the fully differential type.

By using the switched-capacitor adder, the first input signal X, with a bandwidth much lower than the sampling rate, subtracts the voltage reference where its polarity is controlled by the switch-control 81. A delay integrator integrates the result from the SC adder. The integrated value IS1 after the integration of the delay integrator is sent to the autozero comparator 83 and the input of the next stage respectively. The autozero comparator compares IS1 with zero. If IS1 is larger than zero, then the output Y0 will be 1 and the feedback voltage +VREF will be produced; otherwise, Y0 will be $-1$ and $-$VREF will be produced.

The part of IS1 sent to the input of the next stage adds with the output of the differentiator and the result IS3 derived from the switch-control 82. The delay integrator integrates the signal from IS3 node and produces IS2. IS2 is then sent to the differentiator and the autozero comparator 84 for differentiating and comparing with 0 respectively. If IS2 is larger than zero, then the output Y1 will be 1 and the feedback voltage +VREF will be produced; otherwise, Y1 will be $-1$ and $-$VREF will be produced.

The part of IS1 sent to the input of the next stage adds with the output of the differentiator and the result IS3 derived from the switch-control 82. The delay integrator integrates the signal from IS3 node and produces IS2. IS2 is then sent to the differentiator and the autozero comparator 84 for differentiating and comparing with 0 respectively. If IS2 is larger than zero, then the output Y1 will be 1 and the feedback voltage +VREF will be produced; otherwise, Y1 will be $-1$ and $-$VREF will be produced. The produced signal from the switch-control 82 is $\pm 2$Vref, +Vref, and 0.

Those five level output voltages can be determined by the digitally calculated output code, $-Y0-(1-z^{-1})Y1-Y1$. In a fully differential circuit, those five level feedbacks can be implemented by adapting the differential-difference structure to get rid of any linearity problem.

The differential-difference means for producing the feedback signal is in terms of the calculated output code. When the calculated output code is equal to 0, the capacitor CR2 is discharged to ground at phase A, and is discharged to ground at phase B. When the calculated output code is equal to $\pm$Vref, the capacitor CR2 is discharged to ground at phase A, and is charged to $\pm$Vref at phase B. And when the calculated output code is equal to $\pm 2$Vref, the capacitor CR2 is charged to $\pm$Vref at phase A, and is charged to $\pm$Vref at phase B.

The real output code of the third order delta-sigma modulator can be calculated as $Y0+(1-z^{-1})Y1$.

The coefficients a, a' and b in FIG. 4 are used to scale the circuit in FIG. 9. When the input level remains below $-2$ dBr and $a=a'=\frac{1}{4}$, $b=\frac{1}{2}$, the outputs of the differentiator and the two integrators will keep below 0.4 Vref. Hence, the total harmonic distortion and the settling error caused by operational amplifiers will be decreased. Due to the internal noise shaping behavior, the internal voltage after scaling still suffers from the noise coupled by the external environment.

Figure 10:
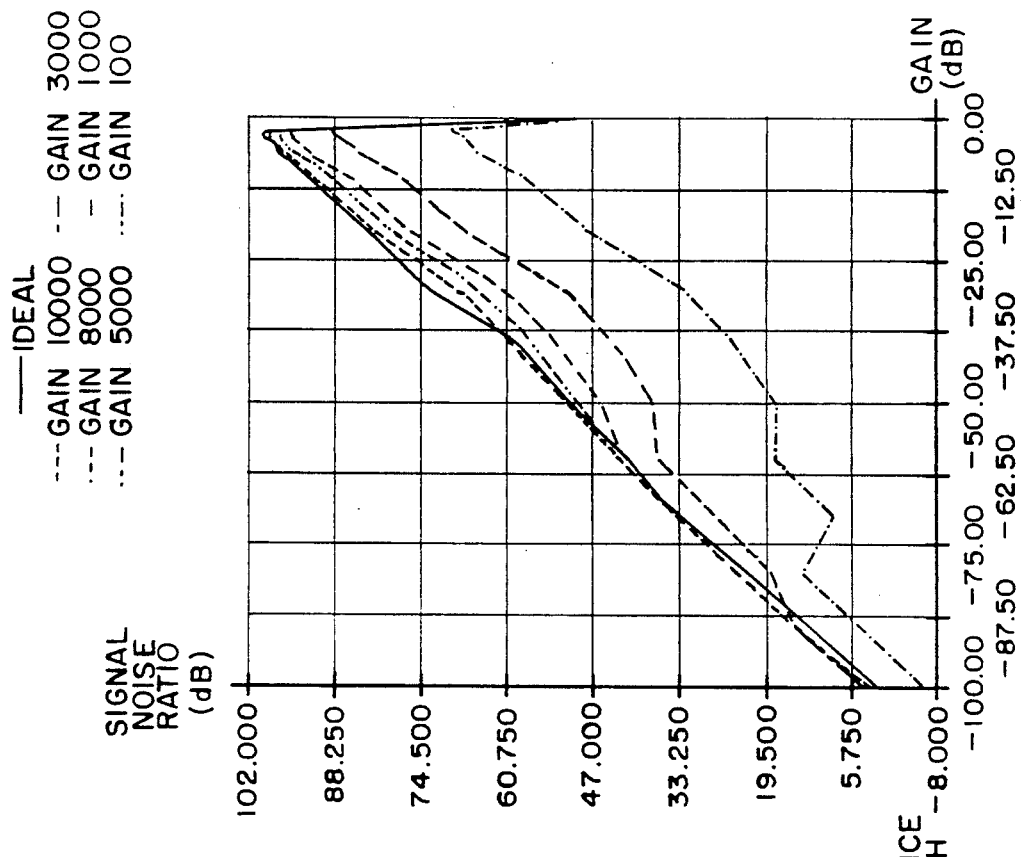
FIG. 10 illustrates the influence of capacitance mismatch on signal-to-noise ratio (SNR).
Figure 11:
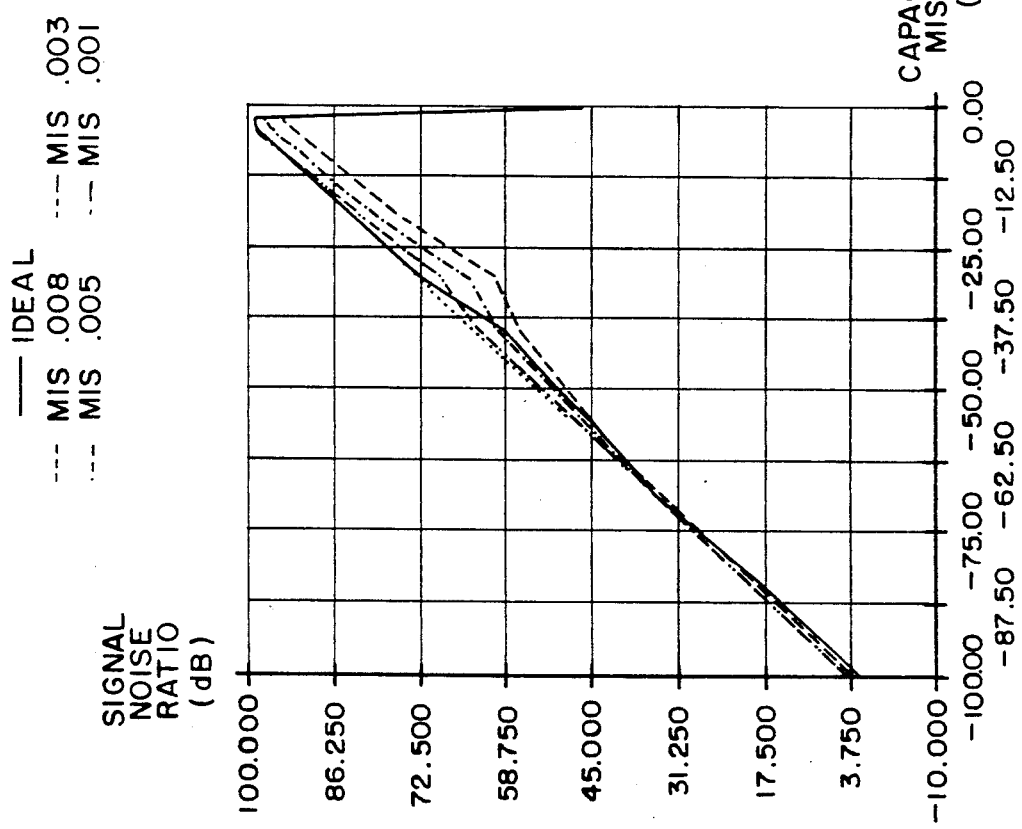
FIG. 11 illustrates the influence of operational amplifier gain of the first stage on SNR.

The performance of this structure is degraded by the mismatch between the first stage and the second stage. The maximum error term induced by the mismatch is due to the difference between Q1 and Q1' which results from the mismatch of CR1/CS1 and CR2/CS2. Another error source comes from the difference between $(1-z^{-1})$analog and $(1-z^{-1})$digital. The nonideal $(1-z^{-1})$analog is mainly due to finite gain leakage and the nonideal settling of the first operational amplifier. It is shown in FIG. 10 and FIG. 11 that the tolerance of the capacitor mismatch is 0.5% and the gain requirement of the first stage operational amplifier is 7000 when the signal-to-noise ratio (SNR) is as high as 97 dB.

The requirement of the second stage is relaxed due to the internal noise-shaping effect. The nonideal effects of this stage are caused by 1) the noise coupled from the previous stage; 2) the nonideal gain error and settling error from the differentiator; and 3) the thermal and flicker noise from the differentiator and the integrators.

The influence of 1) is the same as the prior art in FIG. 3. The additional error sources, for example, gain error and settling error come from the differentiator. In SC differentiator, the gain error and settling error will not be accumulated at low frequency and occur at the output directly. Moreover, the thermal noise and flicker noise of the differentiator is direct-form output. So, the influence of the output of the differentiator is just the same as that of the input of the integrator. It is verified that the influence of the nonideal nature of the differentiator to the integrator of the second stage is no more than 3 dB, and is of no consequence due to the internal noise shaping characteristic.

What is claimed is:

1. An oversampling converter with sampling frequency much higher than the input signal frequency in which the output code contains data and noise after shaping, comprising:
    differentiator means for producing a differentiated signal of negative quantization noise;
    delay integrator means for integrating the summation of the input signal, negative feedback of a first output and the differentiated negative quantization noise;
    quantizer means for receiving and comparing the output of the integrator means to a predetermined reference value, so as to produce the first output as a multi-level output code.

2. An oversampling converter according to claim 1, wherein said negative feedback of the output includes the summation of negative output of the quantizer means and its derivative, said negative quantization noise being the output of the delay integrator means.

3. An oversampling converter according to claim 1, wherein said delay integrator means includes an integrator for amplifying low frequency signal, said differentiator means including the reciprocal transfer function of the delay integrator, and the multiplicand of two transfer functions of the delay integrator means and the differentiator means being equal to one delay term.

4. An oversampling converter according to claim 1, wherein said quantizer means includes three level output codes with +1, −1, 0.

5. An oversampling converter with sampling frequency much higher than the input signal frequency in which the output code contains data and noise after shaping, comprising:
    first delay integrator means having a first feedback node for integrating the summation of the input signal and the negative of a signal appearing on said first feedback node;
    first quantizer means for receiving and comparing the output of the first delay integrator means to a predetermined value so as to produce a two level first output code applied to said first feedback node;
    second delay integrator means having second and third feedback nodes for integrating the summation of a first quantization noise and signals appearing on said second and third feedback nodes;
    differentiator means for producing a differentiated signal of a second negative quantization noise, which differentiated signal is applied to said second feedback node;
    second quantizer means for receiving and comparing the output of the second integrator to a predetermined reference value, so as to produce a two level second output code which is applied to said third feedback node.

6. An oversampling converter according to claim 5, wherein said third feedback node receives the summation of the negative of the first output, the negative of the second output and its derivative, said first negative quantization noise being the output of the first delay integrator means, said second negative quantization noise being the output of the second delay integrator means.

7. An oversampling converter according to claim 5, wherein said first quantizer means receives the summation of the output of the first delay integrator means and the differentiator means.

8. An oversampling converter according to claim 6, wherein said third feedback node receives the summation of the negative of the first output, the negative of the second output and its derivative in digital form, and produces a five level analog output by using a differential difference method.

9. An oversampling converter with sampling frequency much higher than the input signal frequency in which the output code contains data and noise after shaping, comprising:
    differentiator means for producing a differentiated signal of a first negative quantization noise;
    first delay integrator means having a first feedback node for integrating the summation of the input signal, the negative of a signal appearing on the first feedback node and the differentiation signal of the first negative quantization noise;
    first quantizer means for receiving and comparing the output of the first delay integrator to a predetermined value so as to produce a two level first output code applied to the first feedback node;
    second delay integrator means having a second feedback node for integrating the summation of first quantization noise and the negative of a signal appearing on the second node;
    second quantizer means for receiving and comparing the output of the second integrator to a predetermined reference value, so as to produce a two level second output code applied to said second feedback node.

10. An oversampling converter according to claim 9, wherein said first feedback node receives the summation of the negative of the first output code and its derivative, the second feedback node receives the summation of the negative of the first and second output codes, said first negative quantization noise being the output of the first delay integrator.

* * * * *